(12) United States Patent
Hatano et al.

(10) Patent No.: US 7,755,045 B2
(45) Date of Patent: Jul. 13, 2010

(54) SCANNING ELECTRON MICROSCOPE

(75) Inventors: Michio Hatano, Tokyo (JP); Sukehiro Ito, Hitachinaka (JP); Shinichi Tomita, Hitachinaka (JP); Junichi Katane, Naka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 272 days.

(21) Appl. No.: 11/768,291

(22) Filed: Jun. 26, 2007

(65) Prior Publication Data

US 2008/0035843 A1 Feb. 14, 2008

(30) Foreign Application Priority Data

Aug. 11, 2006 (JP) ............................... 2006-219160

(51) Int. Cl.
*H01J 37/26* (2006.01)
(52) U.S. Cl. ..................... 250/310; 250/306; 250/397; 250/399
(58) Field of Classification Search ................. 250/306, 250/309, 310, 311, 397, 399
See application file for complete search history.

(56) References Cited

U.S. PATENT DOCUMENTS

| 5,396,067 | A | * | 3/1995 | Suzuki et al. ............... 250/310 |
| 5,466,936 | A | * | 11/1995 | Kohama et al. ............. 250/310 |
| 5,945,672 | A | | 8/1999 | Knowles et al. |
| 6,657,193 | B2 | | 12/2003 | Dan et al. |
| 2002/0008201 | A1 | * | 1/2002 | Tanaka et al. ............... 250/310 |
| 2005/0127294 | A1 | * | 6/2005 | Katane et al. ............... 250/311 |

FOREIGN PATENT DOCUMENTS

| JP | 2001-126655 | 5/2001 |
| JP | 2002-516647 | 6/2002 |
| JP | 2003-132830 | 5/2003 |

OTHER PUBLICATIONS

Danilatos et al, Scanning vol. 3, pp. 215-217 An atmospheric Scanning Electron Microscope (ASEM), 1980.

* cited by examiner

*Primary Examiner*—Jack I Berman
*Assistant Examiner*—Hanway Chang
(74) *Attorney, Agent, or Firm*—Antonelli, Terry, Stout & Kraus, LLP.

(57) ABSTRACT

In a scanning electron microscope, a reflection plate at ground potential is provided in a specimen chamber and backscattering electrons given off from a specimen impinge on the reflection plate to generate subsidiary electrons. An electric field supply electrode applied with a positive voltage of +100 to +500V is arranged in a gap defined by the reflection plate and a specimen stage. A first detection electrode is arranged to detect ion current attributable to backscattering electrons and a second detection electrode is arranged to detect current representative of coexistence of ion currents attributable to secondary electron and backscattering electron. The scanning electron microscope constructed as above can achieve simultaneous separation/detection of secondary electron and backscattering electron.

15 Claims, 12 Drawing Sheets

SCANNING ELECTRON MICROSCOPE

INCORPORATION BY REFERENCE

The present application claims priority from Japanese application JP2006-219160 filed on Aug. 11, 2006, the content of which is hereby incorporated by reference into this application.

BACKGROUND OF THE INVENTION

The present invention relates to apparatus and method for detection of secondary charged particles applicable to a low vacuum scanning electron microscope (VP-SEM). More particularly, the present invention belongs to apparatus and method in which electrons having information about an observed surface are amplified through their ionization scattering with gas molecules (gas amplification) and at the same time, amplified ions are transferred toward a detection electrode, so that a positive induced current flowing through the detection electrode is detected to form an image.

The VP-SEM based on the detection principle of gas amplification stands for an electron beam apparatus for forming an image by detecting secondary charged particles attributable to electrons given off to the low vacuum atmosphere under irradiation of a primary electron beam and differs from a normal high-vacuum SEM in detection principle and apparatus construction.

Secondary charged particles generated under irradiation of a primary electron beam are accelerated by an electric field and repeat their ionization scattering with residual gas molecules. Because of occurrence of the repetitious ionization scattering, electrons and ions are amplified (gas-amplified) and by detecting the thus amplified ions/electrons at the electron electrode, an image can be formed. The aforementioned ions/electrons can be detected in the form of positive/negative induced currents flowing through the detection electrode. In order to transfer the generated ions/electrons toward the detection electrode, a potential gradient is set up between the detection electrode and a location where ions/electrons develop.

A scheme for detection of positive induced currents based on ion transfer and that for detection of negative induced currents based on electron transfer are quite the same in physical principle with the exception that the potential gradient supplied inside a specimen chamber and the shape of electrode for electric field supply differ for the respective schemes and there are various forms of detectors in accordance with utilization purposes.

For example, JP-A-2001-126655 discloses a VP-SEM using a positive induced current detection system in which a positive ion current detection electrode is mounted to a specimen stage and a secondary electron collector electrode (connected to a high vacuum secondary electron detector) is arranged around an objective lens so as to be used as an electric field supply electrode. Further, JP-A-2003-132830 discloses a VP-SEM having an ion current detection electrode in a curved surface form arranged between an electric field supply electrode and a specimen stage (on a path on which ionization scattering occurs).

As a negative induced current detection system, a system by G. D. Danilatos et al, for example, disclosed in Scanning 3, 215 (1980) is available. In this scheme, an electrode is used in common as electron current detection electrode and electric field supply electrode and potential on the surface of the detection electrode is maintained to be higher than surrounding potential.

Any of the techniques disclosed in the individual prior art references described as above is for detecting ions/electrons attributable to secondary electrons to thereby obtain a low vacuum secondary electron image. But there is a need for observing not only the low vacuum secondary electron image but also a low vacuum backscattering electron image. The secondary electron image is abundant in edge information and is excellent for observation of a surface structure of a specimen. On the other hand, the backscattering electron image is abundant in composition information and is excellent for observation of a composition distribution in a specimen. Accordingly, the advent of a VP-SEM capable of acquiring both the low vacuum secondary electron image and the low vacuum backscattering electron image has been desired.

JP-A-2002-516647 discloses a VP-SEM capable of detecting both the low vacuum secondary electrons and the low vacuum backscattering electrons by using a negative induced current detection scheme. The construction of the VP-SEM disclosed in JP-A-2002-516647 will be described with reference to FIG. 19.

A specimen 102 to be observed is placed in a specimen chamber 101 maintained in a low vacuum pressure atmospheric environment. Above the specimen 102, a plate-shaped or mesh-shaped detection electrode 103 is arranged and further above, a member 104 used in common as reflection plate and electric field supply electrode is arranged. The detection electrode 103 is at ground potential and the reflection plate/electric field supply electrode 104 is applied with a negative voltage of −100V to −500V from a power supply 105.

For SEM observation, a primary electron beam 106 is focused on an observing surface of the specimen 102 by means of an objective lens 107. From a site subject to irradiation of the primary electron beam 106, backscattering electrons 108 and secondary electrons 109 are generated. The secondary electrons 109 having low energy are absorbed by gas molecules or returned to the specimen stage 110 in a region between specimen stage 110 and detection electrode 103 where no potential gradient exists, thus failing to reach the detection electrode 103. On the other hand, the backscattering electrons 108 having high energy impinge on the reflection plate/electric field supply electrode 104 to generate electrons additionally. The thus generated electrons will hereinafter be called subsidiary electrons 111.

The subsidiary electrons 111 are affected by a potential gradient developing in a region between reflection plate/electric field supply electrode 104 and detection electrode 103 so as to be accelerated toward the detection electrode 103. In this process, the subsidiary electrons undergo ionization scattering with gas molecules and electron-ion pairs are newly created. As the subsidiary electrons approach the detection electrode 103, the ionization scattering process develops exponentially and as a result, electrons are amplified. This phenomenon is called gas amplification. With the amplified electrons approaching the detection electrode 103, negative induced current 112 flows through the detection electrode 103. The induced current 112 is amplified by means of an amplifier 113. The primary electron beam 106 is scanned two-dimensionally on the surface of specimen 102 by using a deflector not shown and signals amplified in synchronism with the scanning are displayed on an image processing terminal not shown, thereby providing a low vacuum backscattering electron image.

Then, disclosed in JP-A-2002-516647 is an example of construction according to which a disk-shaped electrode is used in substitution for the mesh electrode and voltage applied to the aforementioned reflection plate and voltage applied to the disk-shaped detection electrode are adjusted, thereby ensuring that the secondary charged particle detection mode can be switched over (among the mode of detection of only secondary electrons, the mode of detection of only backscattering electrons and the mode of detecting both the secondary electrons and the backscattering electrons). This latter configuration will be described with reference to FIG. 20. In this type of configuration, a disk-shaped electrode 114 in the form of a doughnut is used as the detection electrode, independent or separate power supplies 115 and 116 are connected to the detection electrode 114 and the reflection plate/electric field supply electrode 104 so as to be supplied with voltages V1 and V2, respectively. In case secondary electrons 109 at low energy are detected, V1=V2=+500 V is applied. In this phase, the secondary electrons 109 are accelerated toward the detection electrode 114, undergoing gas amplification. At the detection electrode 114, negative induced current 112 can be detected. For detection of coexistent secondary electrons 109 and backscattering electrons 108, the voltage V1 applied to the detection electrode 114 is fixed to a positive value while the voltage V2 applied to the reflection plate/electric field supply electrode 104 being set to a desired value between −V1 and +V1. To this end, however, an amplifier 117 needs to be a floating amplifier.

With the construction of JP-A-2002-516647, the single VP-SEM can be materialized which can by itself acquire both the low vacuum secondary electron image and the low vacuum backscattering electron image.

In the VP-SEM disclosed in JP-A-2002-516647, the secondary electrons 109 and subsidiary electrons 111 originating from backscattering electrons 108 are detected with the same detection electrode 114 and hence they cannot be detected separately or discriminatingly. Accordingly, in the VP-SEM disclosed in JP-A-2005-516647, both the low vacuum secondary electron image and the low vacuum backscattering electron image cannot be detected at a time.

SUMMARY OF THE INVENTION

Incidentally, a semiconductor detector or the like is used as a backscattering electron detector which can be used in combination with a gas amplification detector to detect a backscattering electron image simultaneously but this type of detector is expensive and a cheap backscattering electron detector has been demanded.

Accordingly, it is an object of the present invention to provide a cheap electron detector for VP-SEM which can permit separable and simultaneous detection of secondary electron and backscattering electron.

Another object of this invention is to provide a VP-SEM which applies a suitable operation to separately and simultaneously detected secondary electron and backscattering electron signals and therefore acquires an SEM image for which the degree of separation between secondary electron and backscattering electron can be adjusted freely.

According to the present invention, the above objects can be accomplished by applying a positive induced current detection scheme to a low vacuum scanning electron microscope and providing the VP-SEM with at least one electric field supply electrode for generation of gas amplification and at least two channels of detection means for separating and simultaneously detecting two kinds of induced currents attributable to at least two kinds of different ones of charged particles given off from a specimen.

More particularly, to solve the problem, the two channels of detection means includes a first detection electrode for detecting the induced current attributable to one of the two kinds of different charged particles, a second detection electrode for detecting the induced current attributable to the other of the two kinds of different charged particle and means for separating two kinds of ions obtained through gas amplification of the two kinds of charged particles given off from the specimen and transferring them to the first and second detection electrodes, respectively.

To describe more specifically, a reflection plate on which backscattering electrons from the specimen impinge to generate subsidiary electrons is provided in a specimen chamber and the reflection plate is set to ground potential. Further, in a gap between a specimen stage for holding a specimen to be observed and the reflection plate, an electric field supply electrode applied with positive potential (typically, about +100V to +500V) is provided. In addition, a first detection electrode for detecting ion current attributable to backscattering electrons and a second detection electrode for detecting ion current attributable to secondary electrons (strictly speaking, current of coexistence of ion current due to secondary electrons and ion current due to backscattering electrons) are provided to attain simultaneous and separable detection.

With the above construction, gas amplification of subsidiary electrons and secondary elections is caused to develop by means of a single electric field supply electrode with a minimal scale of construction and at the same time, amplified ions originating from the subsidiary electrons (backscattering electrons) and amplified ions originating from secondary electrons can be detected through independent detection channels, respectively, so that a backscattering electron image and a secondary electron image can be detected separately.

Other objects, features and advantages of the invention will become apparent from the following description of the embodiments of the invention taken in conjunction with the accompanying drawings.

DETAILED DESCRIPTION OF THE INVENTION

Typical embodiments of the present invention will be described by making reference to the accompanying drawings.

Embodiment 1

In the present embodiment as will be described hereunder, a scanning electron microscope capable of acquiring both low vacuum secondary electron image and low vacuum backscattering electron image comprises a backscattering electron detection electrode which is arranged near the illuminating optical axis of a primary electron beam, that is, a so-called on-axis detection type backscattering electron detection electrode and the backscattering electron detection electrode is also used as a reflection plate.

Figure 1:
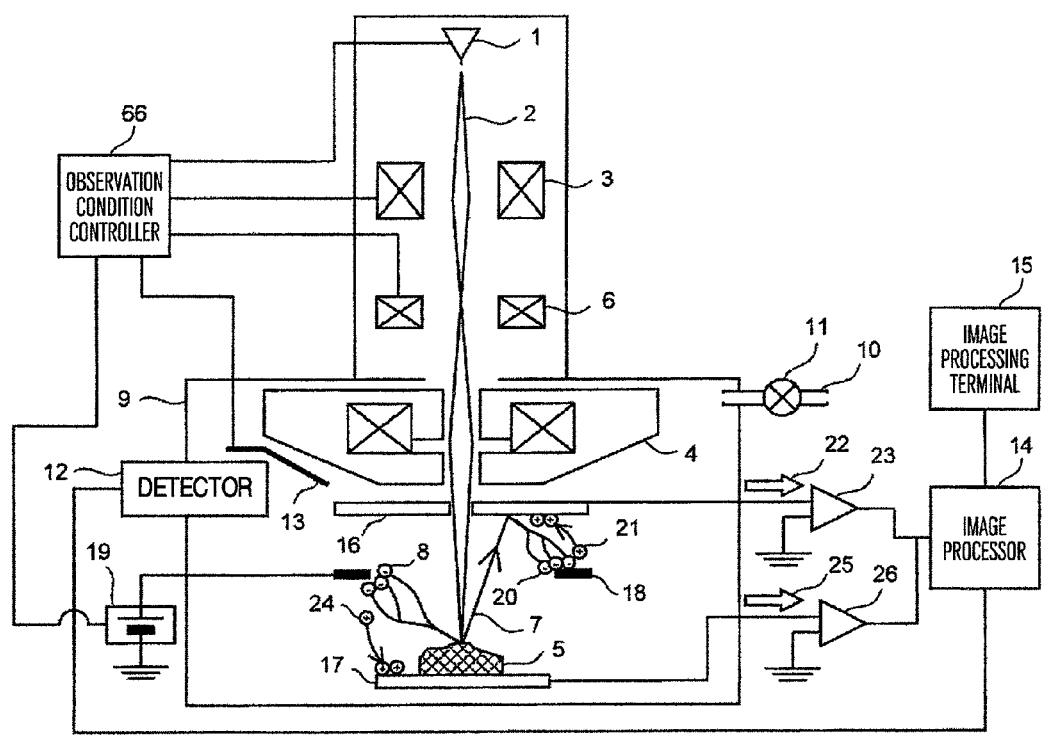
FIG. 1 is a schematic functional diagram showing an example of construction of a scanning electron microscope according to a first embodiment of the invention.

Referring to FIG. 1, in a low vacuum SEM having an on-axis detection type backscattering electron detection means in the form of a reflection plate and detection electrode, a secondary electron detection means is arranged on a specimen stage or in the vicinity thereof as schematically illustrated. The scanning electron microscope as shown in FIG. 1 comprises an electron optics column, a specimen chamber 9, an image processor 14 for processing signals indicative of ion currents attributable to detected secondary electrons/backscattering electrons to form images and an image processing terminal 15 connected to the image processor. The image processing terminal 15 includes a display means for displaying formed images, and an information input means for inputting information necessary for operation of the apparatus to a GUI displayed on the display means. It will be appreciated that individual parameters in the electron optics column such as for example accelerating voltage of the primary electron beam and currents/voltages applied to individual electrodes can be adjusted with an observation condition controller 66.

An electron gun 1 housed in the scanning electron microscope column is constructed of a tungsten heating electron gun to generate a primary electron beam 2 typically at 0.5 to 30 KeV energy. A condenser lens 3 having the function to converge the primary electron beam 2 is so set that the primary electron beam 2 can be placed in optical condition suitable for SEM observation. An objective lens 4 having the function to focus the primary electron beam 2 focuses it on an observation target portion on a specimen 5. The bottom of objective lens 4 forms the bottom of the electron optics column. A deflector 6 scans the irradiation position of primary electron beam 2 on the specimen 5 in accordance with a desired observation view field range. Under irradiation of the primary electron beam 2, backscattering electrons 7 and secondary electrons 8 are generated from the specimen. The degree of vacuum inside the specimen chamber 9 housing the specimen 5 is controlled by opening/closing a needle valve 11 at an intake port 10 for admitting atmospheric air to the specimen chamber 9.

The present VP-SEM has, in addition to the observation mode at low vacuum, the observation mode at high vacuum and during the observation mode at high vacuum, the needle valve 11 is closed and the vacuum condition inside the specimen chamber 9 is maintained at a high vacuum condition of $10^{-3}$ Pa or less. The secondary electrons 9 generated from the specimen 5 are detected with a secondary electron detector for high vacuum. In the present embodiment, for high vacuum, an Everhart Thornley type detector 12 comprised of a scintillator and a photomultiplier tube was used as the high vacuum secondary electron detector. In this case, in order to enhance the efficiency of capture of secondary electrons 8, a potential gradient is set up in the specimen chamber 9 by means of a secondary electron collector electrode 13 applied typically with +300V. On the other hand, the backscattering electrons 7 are detected with a not shown backscattering electron detector arranged immediately beneath the objective lens 4. Used as the backscattering electron detector is a semiconductor detector or micro-channel plate. After being electrically amplified individually, detected signals are A/D converted in the image processor 14 and displayed on the image processing terminal 15 in synchronism with scanning of the primary electron beam 2. In this manner, an SEM image within the observation view field range can be obtained.

During observation at low vacuum, the gas pressure inside the specimen chamber 9 is kept constant by open/close of the needle valve 11. In addition, the potential on the secondary electron collector electrode 13 is switched over to ground potential. Typically, the gas pressure is 1 to 300 Pa.

Arranged immediately below the objective lens 4 is a disk-shaped reflection plate 16 at ground potential. In the present embodiment, the reflection plate 16 is used also as a first electron detection electrode for detecting induced current attributable to backscattering electrons, having its bottom (confronting the specimen stage) forming a bombardment surface on which backscattering electrons given off from the specimen impinge. Then, since the bombardment surface is also used as a detection surface of ion current attributable to backscattering electrons, an electrode for ion current detection is formed on the bombardment surface. The reflection plate 16 is shaped symmetrically to the optical axis of the primary electron beam 2. The outer diameter of reflection plate 16 is not particularly limited but for avoidance of interference with structural components inside the specimen chamber 9, it may typically be approximately 50 mmφ or less.

Formed in the center of the reflection plate 16 is a circular hole for passage of the primary electron beam 2 and the hole diameter may typically be approximately 1 to 5 mmϕ. In a gap between reflection plate 16 and specimen stage 17, a doughnut-shaped disk type electric field supply electrode 18 is interposed. The electric field supply electrode 18 is shaped symmetrically to the optical axis of the primary electron beam 2. A positive voltage of +100 to +500 V is applied from a power supply 19 for electric field supply electrode to the electric field supply electrode 18. A gap defined by reflection plate 16 and electric field supply electrode 18 is about 1 mm to 10 mm. If the gap is excessively large, observation carried out when the working distance (WD) is short tends to be troubled and therefore, the gap is generally set to 1 mm to 3 mm. The electric field supply electrode 18 has its outer diameter being in general substantially identical to that of the reflection plate 16, having its inner diameter being about 20 mm. The maximum value the angle detection range of backscattering electrons 7 given off from the specimen has is determined by the inner diameter of electric field supply electrode 18 and if a larger detection angle range is desired, then the inner diameter of electric field supply electrode 18 may be larger than 20 mm. In case of the WD being short (for example, WD=5 mm), a large detection range can be set up even when the inner diameter of electric field supply electrode 18 is lessened and therefore, the inner diameter of the electric field supply electrode can be less than 20 mm. In any case, the outer diameter of the electric field supply electrode 18 is set to (the inner diameter +10 mm to 30 mm). To add, the outer diameter of reflection plate 16 may be smaller than the inner diameter of electric field supply electrode 18. In this case, the angle detection region of backscattering electrons 7 may sometimes be determined by the outer diameter of the reflection plate 16. In any case, the size of each of the reflection plate 16 and electric field supply electrode 18 is so determined as to assure a desired angle detection region in correspondence with the WD for observation.

The needle valve 11 for adjustment of gas pressure, voltage applied to the secondary electron collector electrode 13 and voltage applied to the electric field supply electrode 18 are set to conditions suitable for an observation condition by means of the observation condition controller 66. It will be appreciated that during low vacuum observation, the gas pressure and voltage applied to the electric field supply electrode 18 may be set to setting values the user desires.

Backscattering electrons at low vacuum can be detected as will be described below.

Backscattering electrons 7 given off from the specimen 5 have high energy (about 0.5 KeV or more) compared to secondary electrons and they can therefore reach the bombardment surface of reflection plate 16 even in the low vacuum atmosphere. The backscattering electrons 7 impinging on the reflection plate 16 interact with the bombardment surface to emit subsidiary electrons 20 at a low energy level of approximately several eV. The subsidiary electrons 20 are so affected by an electric field supplied from the electric field supply electrode 18 as to be accelerated. In this process, gas amplification develops, so that electrons and ions can be amplified near the electric field supply electrode 18. Ions 21 originating from the thus amplified subsidiary electrons 20 are drifted toward the reflection plate 16 at low potential. A potential gradient is set up across each of the reflection plate 16 at ground potential and specimen stage 17 also at ground potential and the electric field supply electrode 18 which is solely applied with a positive voltage. Accordingly, most of ions 21 originating from the subsidiary electrons 20 created above the electric field supply electrode 18 are drifted toward the reflection plate 16. By dint of the drifting ions 21, positive induced current 22 attributable to the backscattering electrons flows through the reflection plate 16. Since a backscattering electron detection amplifier 23 for amplifying the induced current 22 is connected to the reflection plate 16, a current signal can be amplified at a desired gain.

On the other hand, detection of secondary electrons in low vacuum is carried out as will be described below.

Secondary electrons 8 given off from the specimen 5 at an energy level of approximately several eV are accelerated by an electric field supplied from the electric field supply electrode 18. In this process, gas amplification develops and electrons and ions are amplified near the electric field supply electrode 18. Most of ions 24 originating from the thus amplified secondary electrons are drifted toward the specimen stage 17 in a direction reverse to that of the ions 21 originating from the subsidiary electrons 20. The specimen stage 17 is provided with a second detection electrode for detection of positive induced current 25 originating from the drifting secondary electrons and the induced current 25 detected by the second detection electrode is amplified at a desired gain by means of a secondary electron detection amplifier 26. As will be seen from the above, according to the present embodiment, by the action of the potential difference established between the electric field supply electrode 18 and each of the first and second detection electrodes, the effect of separation between backscattering electron and secondary electron and the effect of drifting toward the detection electrode can be realized.

In embodiment 1, the distance of each of the reflection plate 16 and electric field supply electrode 18 from the specimen 7 can be changed upward or downward in accordance with raising/lowering of the specimen stage (raise/lower of WD) in order that the relative distance can be conserved. In this case, up and down movement of the reflection plate 16 and electric field supply electrode 18 can be effected with a drive unit not shown.

In any of the low vacuum mode and the high vacuum mode, an acquired signal is amplified electrically and thereafter subjected to A/D conversion in the image processor 14 and then displayed on the image processing terminal 15 in synchronism with scanning of the primary electron beam 2. Through this, an SEM image in the observation view field range can be obtained.

As described above, according to the present invention, the electric field supply electrode 18 applied with positive voltage provides in a gap between the reflection plate 16 and specimen stage 17 an electric field by which not only gas amplification but also energy discrimination can be executed. The potential gradient accelerates electrons at low energy (mainly secondary electrons 8) toward the electric field supply electrode 18 and as a result, they cannot reach the reflection plate. On the other hand, electrons at high energy (backscattering electrons 7) are not affected by the electric field, succeeding in arriving at the reflection plate 16. Through this, energy discrimination can be achieved.

But, backscattering electrons at low energy are also contained in the low energy electrons and induced current 25 detected from the specimen stage 17 also contain information originating from the backscattering electrons. In addition, ions near the electric field supply electrode 18 behave substantially randomly and so, probably, part of ions 21 originating from the subsidiary electrons 20 will drift toward the specimen stage 17 or ions 24 originating from the secondary electrons 8 will similarly drift toward the reflection plate 16. As a result, the obtained backscattering electron image and secondary electron image may probably be mixed with a slight amount of counterpart information. To cope with this problem, the image processor 14 of the invention has an image processing function capable of multiplying the individual obtained signals by desired weighting values and adding or subtracting the weighted signals to deliver a synthesis image.

Figure 2:
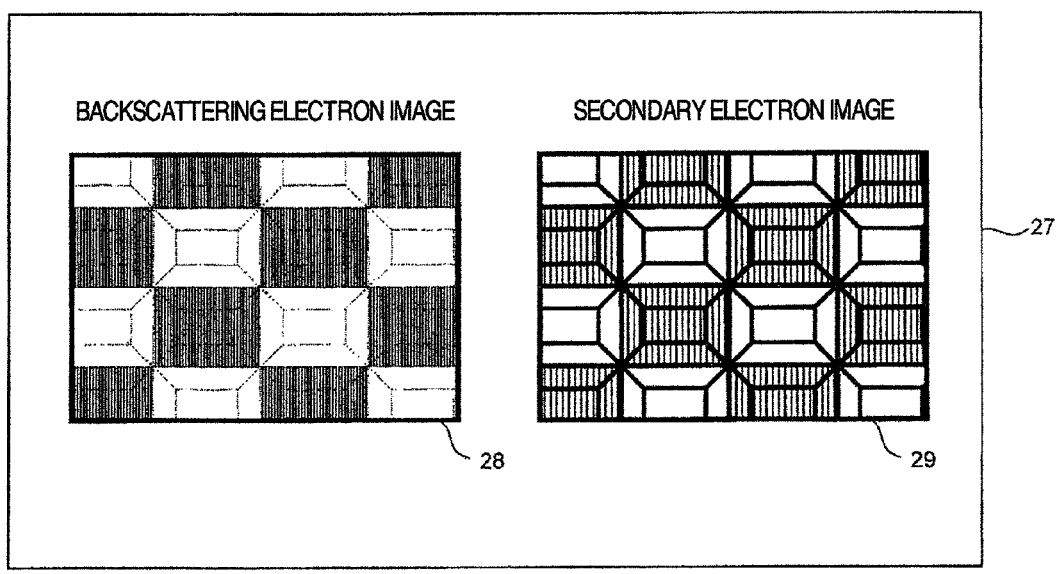
FIG. 2 is a diagram showing outputted pictures on an display screen of an image processing terminal when an electron image and a backscattering electron image are displayed at a time in the scanning electron microscope according to the first embodiment.
Figure 3:
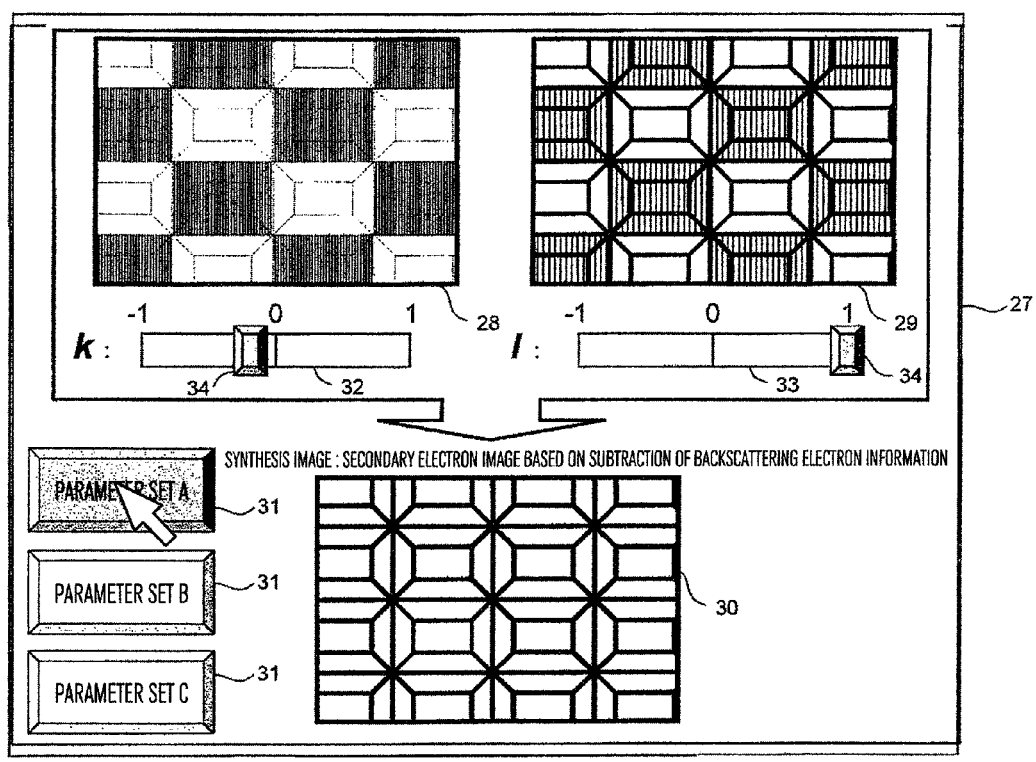
FIG. 3 is a diagram illustrating a state when parameters k and l for preparing a synthesis image are called out in the first embodiment.

The image processing function will be described with reference to FIGS. 2 to 4. Pictures on the screen of image processing terminal 15 are diagrammatically illustrated in FIGS. 2 to 4. As shown in FIG. 2, on screen 27 of the image processing terminal, simultaneously acquired backscattering electron image 28 and secondary electron image 29 are displayed. Contrast and brightness the individual images exhibit can be adjusted by adjusting the gain of the amplifier automatically or manually. In FIG. 3, on screen 27 of the image processing terminal, an output synthesis image 30 representing a third image obtained by electrically adding or subtracting the backscattering electron signal and the secondary electron signal through the image processing function is additionally illustrated.

For example, the synthesis image is prepared through the image processing function as follows.

Assuming that brightness per digital converted pixel is A and B for the backscattering electron signal and secondary electron signal, respectively, an image having a brightness level of $C=k\times A+l\times B$ per pixel is delivered as a synthesis image, where k and l are parameters each having values of $-1$ to $+1$ and are constant for one image. Alternatively, k and l may depend on a brightness value of each pixel and for example, k may be a function of A and l may be a function of B.

A set of parameters k and l can be determined from either the result of observation and image synthesis carried out by the designer in advance through the use of a standard sample or a plurality of parameter sets packaged precedently.

Available as examples of parameter set are "a parameter set for secondary electron image based on subtraction of backscattering electron information" such as $k=-0.1$ and $l=+1$ (see FIG. 3), "a parameter set for backscattering electron image based on subtraction of secondary electron information" such as $k=+1$ and $l=-0.1$ (see FIG. 4) and "a parameter set for a mixed image of backscattering electron information and secondary electron information" for which $k=+1$ and $l=+1$.

In order to call out the parameter set, the user is allowed to input a key corresponding to each parameter set by means of a keyboard or to select a button corresponding to a desired set from buttons 31 displayed on the screen 27 as shown in FIG. 3 and click the selected button. Illustrated in FIG. 3 is a state when "a parameter set for secondary electron image based on subtraction of backscattering electron information" is selected.

Figure 4:
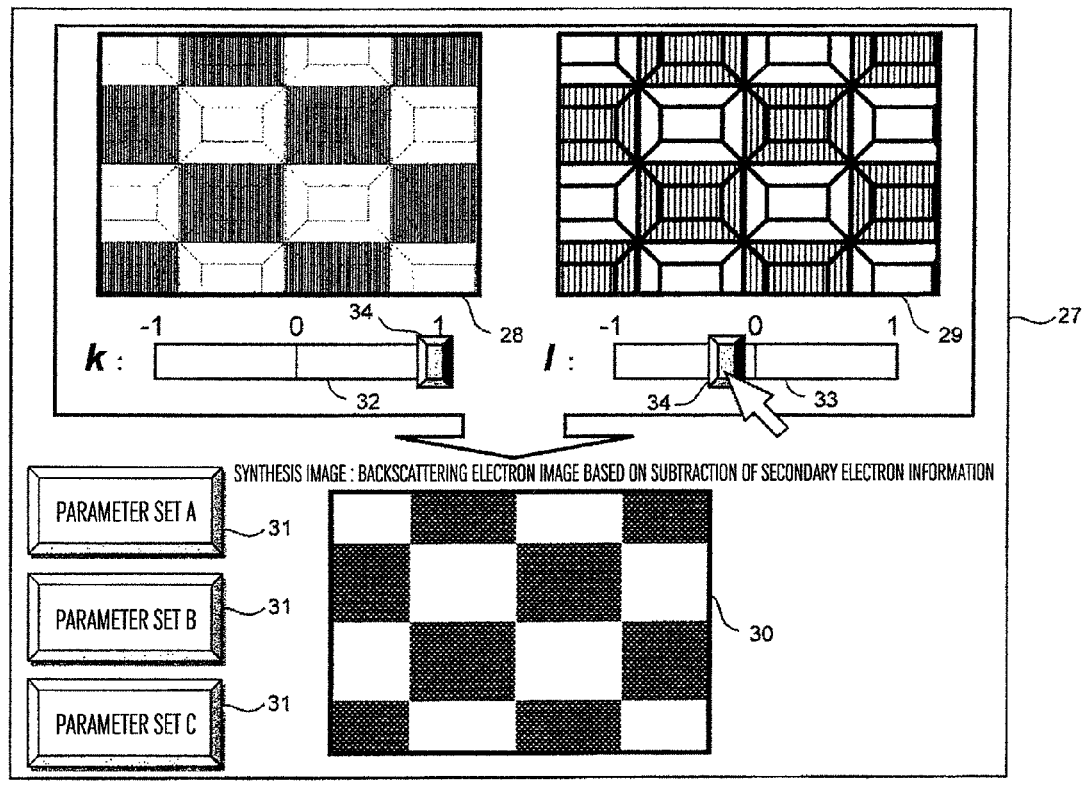
FIG. 4 is a diagram illustrating a state when the individual parameters k and l for preparation of the synthesis image are set on a GUI in the first embodiment.

The individual parameters k and l may be set arbitrarily so that the user may acquire a desired image while observing images and in that case, the user may set the parameters by means of a manually operating unit such as a keyboard or dial while watching, for example, k-value bar 32 and l-value bar 33 on the screen 27 shown in FIG. 4. In this case, a movable bar 34 outputs a value of the present k or l corresponding to the operation. Further, as shown in FIG. 4, the movable bar 34 on the screen 27 may be moved directly to right or left by clicking and dragging a mouse. The image processor 14 reflects the operation to display a synthesis image corresponding to the values of k and l designated by the user on the screen 27. A state in which "a parameter set for backscattering electron image based on subtraction of secondary electron information" can be realized through an adjustment the user makes by adjusting the movable bar 34 while clicking and dragging the mouse is illustrated in FIG. 3.

The both signals for synthesis image are not necessarily digital signals but may be analog signals. In that case, image synthesis similar to that of digital signals is carried out by means of an analog circuit.

Figure 5:
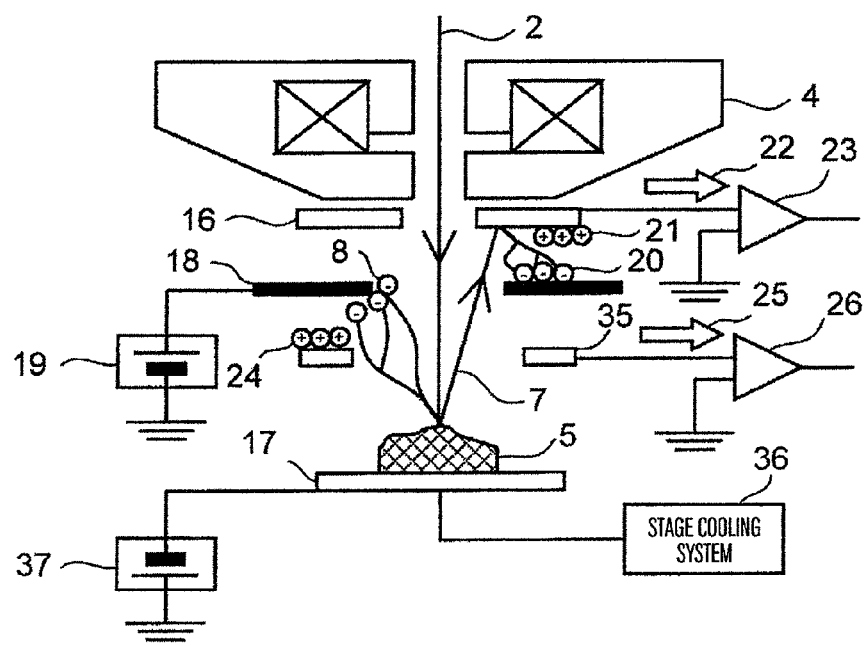
FIG. 5 is a schematic diagram showing another example of construction of an optical system essential part in the first embodiment.

Turning to FIG. 5, the scanning electron microscope constructed as shown in FIG. 1 is modified such that the second detection electrode is arranged at a location other than the specimen stage. In the following description, components common to those in the FIG. 1 construction example will not be explained. A disk-shaped detection electrode 35 in the form of a doughnut at ground potential is interposed between electric field supply electrode 18 and specimen stage 17. The detection electrode 35 is shaped symmetrically to the optical axis of primary electron beam 2. The inner diameter of detection electrode 35 is equal to or less than that of the electric field supply electrode 18, generally having a value which is approximately {(inner diameter of electric field supply electrode 18) $-10$ mm$\phi$}. The distance between detection electrode 35 and electric field supply electrode 18 is about 1 mm to 10 mm.

In the construction example in FIG. 5, secondary electrons 8 given off from the specimen stage are accelerated in accordance with an electric field supplied from the electric field supply electrode 18, causing gas amplification near the electrode 18. Amplified ions 24 are drifted toward the detection electrode 35 at earth potential and positive induced current 25 originating from the secondary electrons flows through the detection electrode 35.

The construction example as shown in FIG. 5 has many advantages over the construction exemplified in FIG. 1.

Firstly, since the signal need not be detected from the specimen stage, the specimen stage can be used in combination with a stage cooling system 36 for cooling the specimen stage 17. In case the stage cooling system is employed in the FIG. 1 construction example, the amplifier connected to the specimen stage 17 picks up a noise signal from the stage cooling system, making image observation difficult but in the FIG. 5 construction example, the signal is detected from the detection electrode and so the combination use of stage cooling system 36 can be permitted while keeping the image from being affected by noise.

Secondly, the stray capacitance of detection electrode 35 can be reduced to ameliorate the response of amplifier circuit 26. More particularly, while in the FIG. 1 construction example the amplifier is connected to the structurally complicated specimen stage 17 having a large stray capacitance which in turn causes the response of output signal to be retarded. Thanks to the simplified structure of the detection electrode 35 in the FIG. 5 construction example, the stray capacitance can be reduced to ⅓ or less of that of the specimen stage 17.

In the third place, the detection electrode 35 is distant from the specimen stage 17 and the degree of freedom of design can be increased in optimizing the potential gradient between electric field supply electrode 18 and second detection electrode 35. More specifically, in the FIG. 1 construction example, an electrode impersonating the detection electrode 35 is formed on the specimen stage 17 and therefore its design shape is restricted by the surface shape of specimen stage 17 and hence the potential gradient cannot be optimized unless the shape of electric field supply electrode 18 is contrived. On the contrary, since in the FIG. 5 construction example there is room for contrivance of the distance and shape in connection with both the electric field supply electrode 18 and the detection electrode 35, the degree of freedom of design can be promoted over the FIG. 1 construction example in setting up a potential gradient suitable for gas amplification.

In the fourth place, in order for the secondary electrons 8 given off from the specimen stage 17 to be accelerated toward the electric field supply electrode 18, negative voltage can be applied to the specimen stage 17. Then, the voltage is supplied from a power supply for specimen stage 37 and the application voltage is typically 0 to −500V. When making an attempt to apply the voltage to the specimen stage 17 in the FIG. 1 construction example, the amplifier needs to be a floating amplifier and the manufacture cost will therefore be raised in comparison with the FIG. 5 construction example.

In the FIG. 5 construction example, the distance between each of the reflection plate 16, electric field supply electrode 18 and detection electrode 35 and the specimen stage 17 may be changed upwardly or downwardly in order to conserve the relative distance of each member to the specimen stage in accordance with up and down movement of the specimen stage 17. In this case, up and down movement of the members 16, 18 and 35 may be effected with a drive unit not shown.

Figure 6:
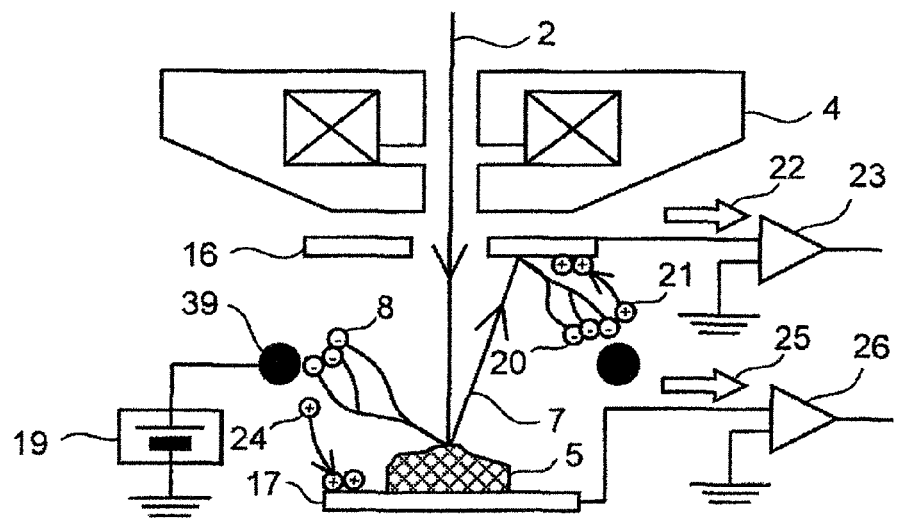
FIG. 6 is a diagram illustrating a still another example of construction of the optical system essential part in the first embodiment.

Referring to FIG. 6, an analogous type modification will be described. In an example of construction as shown in FIG. 6, a counterpart of the electric field supply electrode in the FIG. 1 construction example is shaped in the form of a ring having a circular cross-section. In this case, the distance between electric field supply electrode 39 and reflection plate 16 may preferably be about 1 to 5 mm and the diameter of the electrode may preferably be about 1 to 10 mm. The electric field supply electrode 30 is shaped symmetrically to the center axis of the reflection plate 16. Backscattering electrons 7 and secondary electrons 8 can be detected in the same way as that in embodiment 1.

Figure 7:
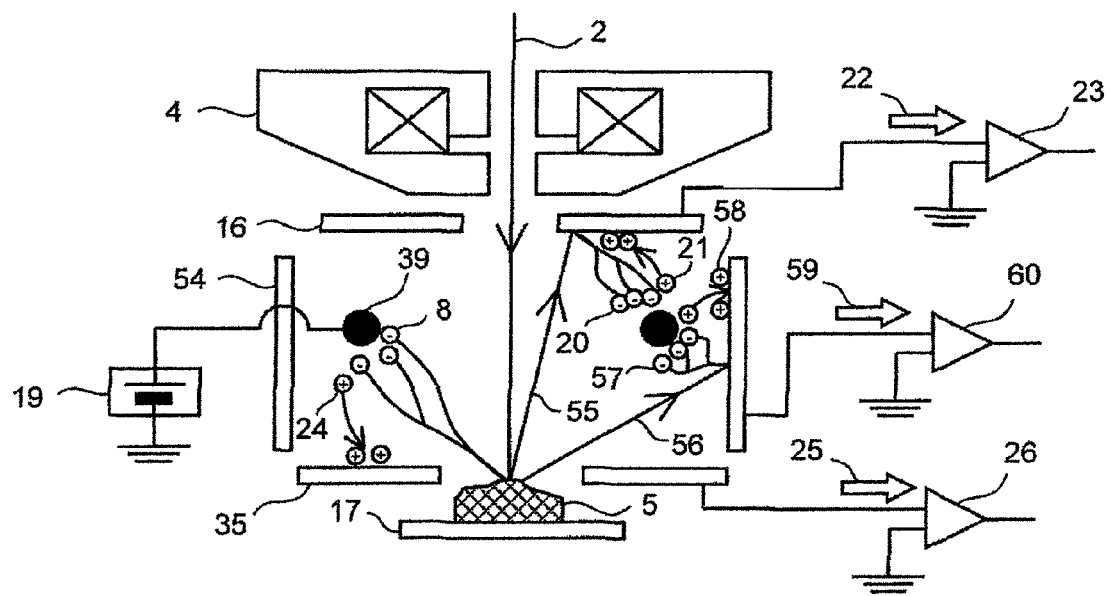
FIG. 7 is a diagram illustrating a still another example of construction of the optical system essential part in the first embodiment.

Referring to FIG. 7, another analogous type modification will be described. In a construction example of FIG. 7, an electric field supply electrode is shaped in the form of a ring having a circular cross-section and a cylindrical reflection plate 54 for detection of low angle backscattering electrons is interposed between the reflection plate 16 and the second detection electrode 35 in the FIG. 5 construction example. The reflection plate 16, low angle backscattering electron detection reflection plate 54, detection electrode 35 and electric field supply electrode 39 are arranged symmetrically to the optical axis of primary electron beam 2.

In the FIG. 7 construction example, angles of backscattering electrons given off from the specimen can be discriminated in terms of elevation angle. A method for angle discrimination will be described hereunder.

Backscattering electrons 55 reflected in a direction making a small elevation angle to the optical axis of primary electron beam 2 (called high angle backscattering electrons) impinge on the reflection plate 16, creating subsidiary electrons 20. On the other hand, backscattering electrons 56 reflected in a direction making a large elevation angle to the optical axis of primary electron beam 2 (called low angle backscattering electrons) impinge on a low angle scattering electron detection reflection plate 54, creating subsidiary electrons 57 originating from the low angle backscattering electrons 56. In order to detect many low angle backscattering electrons, the low angle backscattering electron detection reflection plate 54 is arranged in a space defined by the reflection plate 16 representing the high angle backscattering electron detection electrode and the second detection electrode 35 representing the secondary electron detection electrode, having its center axis being coincident with the optical axis of the primary electron beam. In other words, the reflection plate 54 is arranged such that the normal of its electron bombardment surface is perpendicular to the primary electron beam optical axis.

Subsidiary electrons 20, subsidiary electrons 57 originating from the low angle backscattering electrons 56 and secondary electrons given off from the specimen are accelerated toward the electric field supply electrode 39, causing gas amplification to develop. Of ions amplified by the gas amplification, ions 21 originating from the subsidiary electrons 20, ions 58 originating from the subsidiary electrons 57 and ions 24 originating from the secondary electrons 8 are drifted toward the reflection plate 16, low angle backscattering electron detection reflection plate 54 and detection electrode 35, respectively, causing positive induced currents 22, 59 and 25 to flow through the reflection plates 16 and 54 and the detection electrode 35, respectively. Signals thus obtained are amplified with amplifiers 23, 60 and 26 connected to the reflection plates and detection electrode, respectively. In this manner, SEM images having three kinds of different information can be obtained. These three kinds of images can be combined arbitrarily to acquire a synthesis image according to the method described in connection with embodiment 1.

In the FIG. 7 construction example, the reflection plate 16, low angle backscattering electron detection reflection plate 54, detection electrode 35 and electric field supply electrode 39 may be moved upwardly or downwardly by means of a drive unit not shown so that as the specimen stage 17 moves upward or downward, the relative distance of each of the above members to the specimen 5 may be conserved.

Figure 8:
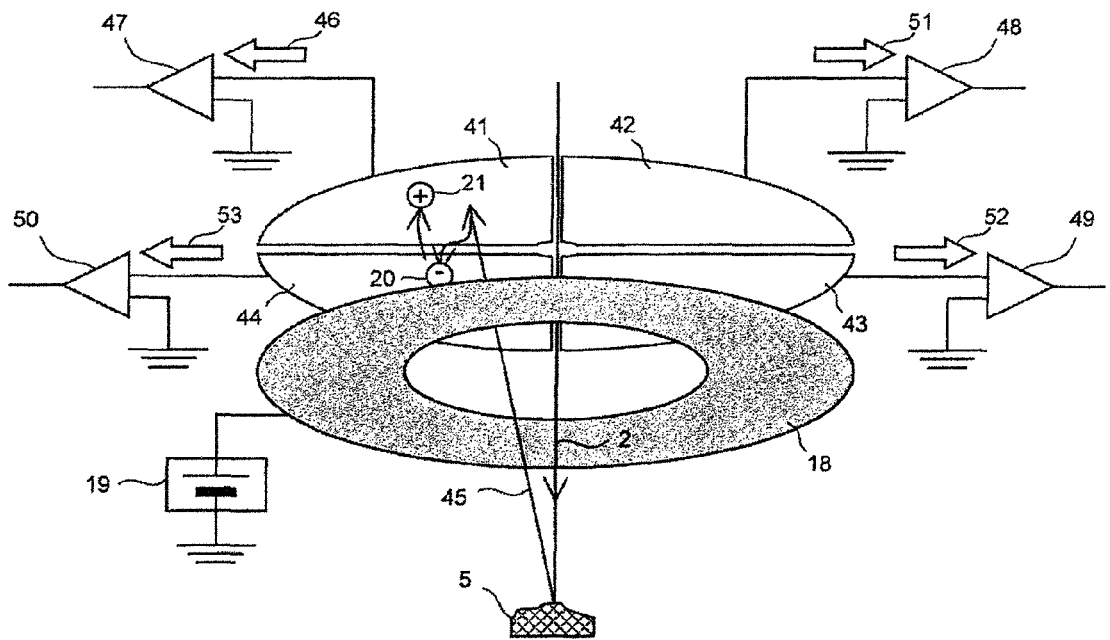
FIG. 8 is a diagram illustrating a reflection plate constructed of a plurality of divisional segments in the first embodiment.

Referring to FIG. 8, an example of construction applicable to the aforementioned construction examples in the present embodiment will be described in which the induced current detection surface of an on-axis detection type electrode is divided into a plurality of segments to enable azimuth angles of backscattering electrons to be discriminated. In the construction exemplified in FIG. 8, the ion current detection surface of the first detection electrode, that is, reflection plate 16 is divided into four segments of detection areas a41 to d44.

Backscattering electrons 45 generated under irradiation of a primary electron beam pass through an opening of electric field supply electrode 18 and impinge on any segments of detection areas a41 to d44 in accordance with azimuthal components the backscattering electrons originally have. A backscattering electron 45 impinging on a specified detection segment, for example, the detection area a41 creates a subsidiary electron 20. The thus created subsidiary electron 20 is drifted toward the electric field supply electrode 18, causing gas amplification. Most of amplified ions 21 are drifted toward the detection area a41 and positive induced current 46 flows through the detection area a41. A current signal is amplified with an amplifier 47 for detection area a41 connected thereto and an SEM image is obtained. Similarly, amplifiers 48 to 50 dedicated to the individual reflection plate detection areas b42 to d44 are connected thereto to amplify positive induced currents 51 to 53 originating from backscattering electrons impinging on corresponding detection areas b42 to d44, respectively. Four kinds of signals as above depend on emission azimuths of individually detected backscattering electrons, respectively, having different pieces of structural information of the specimen surface, respectively. Accordingly, from the respective signals, SEM images containing four kinds of different specimen dependent information pieces can be obtained. It will be appreciated that the azimuth discriminative detection system shown in FIG. 8 can be used in combination with any construction examples of the present embodiment.

Analogous forms of the present embodiment have been described using the construction examples shown in FIG. 1 to 8 and the image signal processing method explained in connection with the FIG. 1 construction example can be applicable to any of the construction examples in the present embodiment. Especially, in combination with the azimuth angle discrimination detection system shown in FIG. 8, new information concerning the surface shape of the specimen can be extracted. For example, by performing subtraction of signals among a plurality of images, anisotropy of the specimen surface shape dependent on azimuth angles can be emphasized and consequently, a synthesis image putting emphasis on the stereoscopic structure can be acquired.

Embodiment 2

The embodiment using the on-axis backscattering electron detection type and using backscattering electron detection electrode and reflection plate in common has been described in connection with embodiment 1 but in embodiment 2, an embodiment also being of the on-axis detection type but not using the backscattering electron detection electrode and the reflection plate in common will be described.

Figure 9:
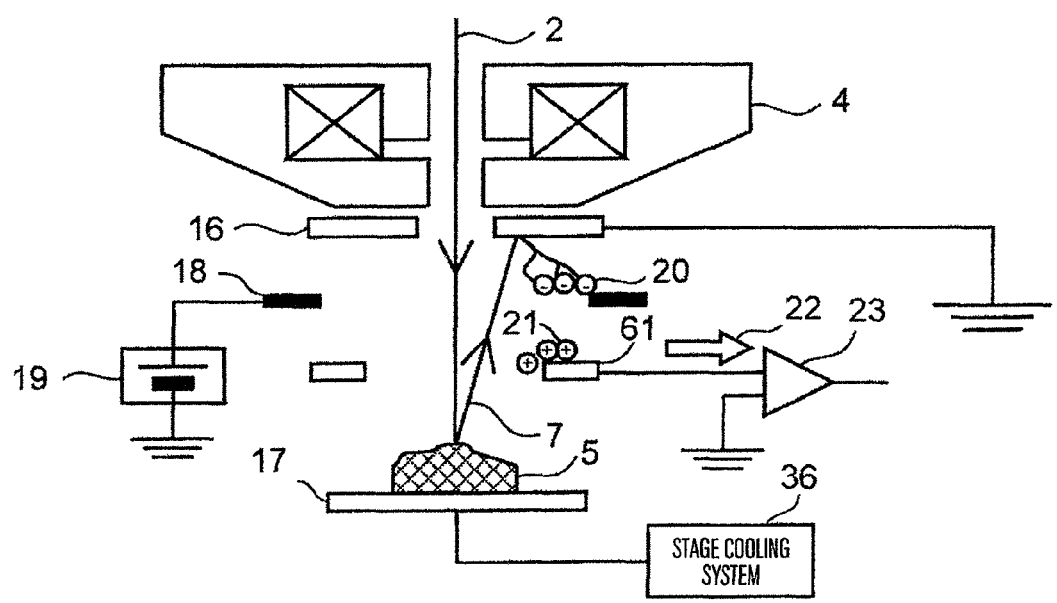
FIG. 9 is a schematic functional diagram illustrating an example of construction of an optical system essential part in a second embodiment of the invention.

Referring to FIG. 9, a construction example of the present embodiment will be described. A scanning electron microscope in the FIG. 9 construction example is the same as the apparatus of FIG. 1 construction example with the exception that a disk-shaped detection electrode 61 for backscattering electron detection in the form of a doughnut is arranged in a space between reflection plate 16 and specimen stage 17. Unlike the individual construction examples explained in connection with embodiment 1, the reflection plate is grounded. With a view to promoting the efficiency of detection of gas amplified ions 21, the detection electrode 61 has its inner diameter smaller than that of an electric field supply electrode 18. The gas amplified ions 21 are drifted toward the detection electrode 61 and positive induced current 22 flows through the detection electrode 61. A current signal thus obtained is amplified with a backscattering electron detection amplifier 23 to obtain an SEM image. With the FIG. 9 construction example, the stage cooling system 36 for cooling the specimen may be introduced as in the case of the FIG. 5 construction example.

The reflection plate 16, electric field supply electrode 18 and detection electrode 61 in the FIG. 9 construction example may by moved upwardly or downwardly by means of a not shown drive unit in order that the relative distance of each of the members to the specimen 5 can be conserved as the specimen stage 17 moves upwardly or downwardly.

Figure 10:
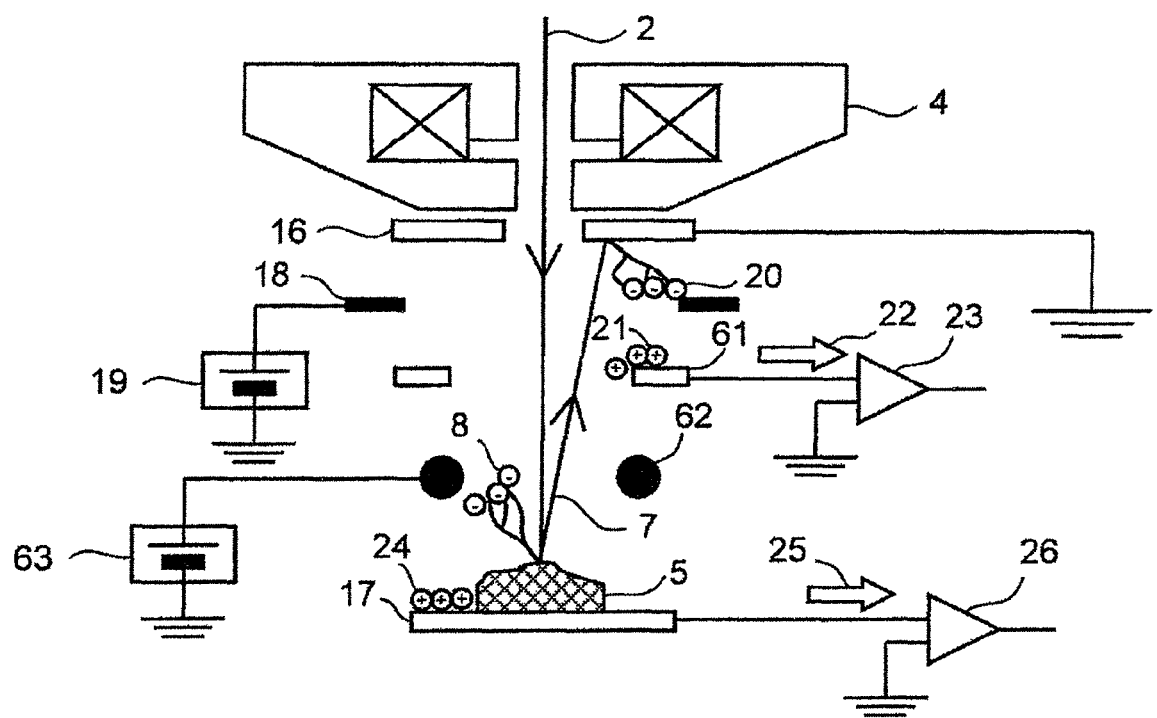
FIG. 10 is a schematic diagram illustrating another example of construction of the optical system essential part in the second embodiment.

The FIG. 9 construction example can be modified as shown in FIG. 10. A scanning electron microscope according to the present modification comprises a ring-shaped electric field supply electrode 62 for secondary electron amplification having a circular cross-section like the electric field supply electrode in the examples of FIGS. 9 and 12 in a gap between the disk-shaped detection electrode 61 for backscattering electron detection in the form of a doughnut and the specimen stage 17 explained in connection with the FIG. 9 construction example. A positive voltage of +100 to +500V is supplied to the electric field supply electrode 62 from a power supply 63 for secondary electron amplification electric field supply electrode. As a result of gas amplification of secondary electrons 8, amplified ions 24 are drifted toward the specimen stage 17. Positive induced current 25 originating from the secondary electrons is detected with a secondary electron detection amplifier 26 connected to the specimen stage 17.

The reflection plate 16, electric field supply electrode 18, detection electrode 61 and electric field supply electrode 62 in the present construction example may by moved upwardly or downwardly in order that the relative distance of each of these members to the specimen 5 can be conserved as the specimen stage 17 moves upward or downward.

Figure 11:
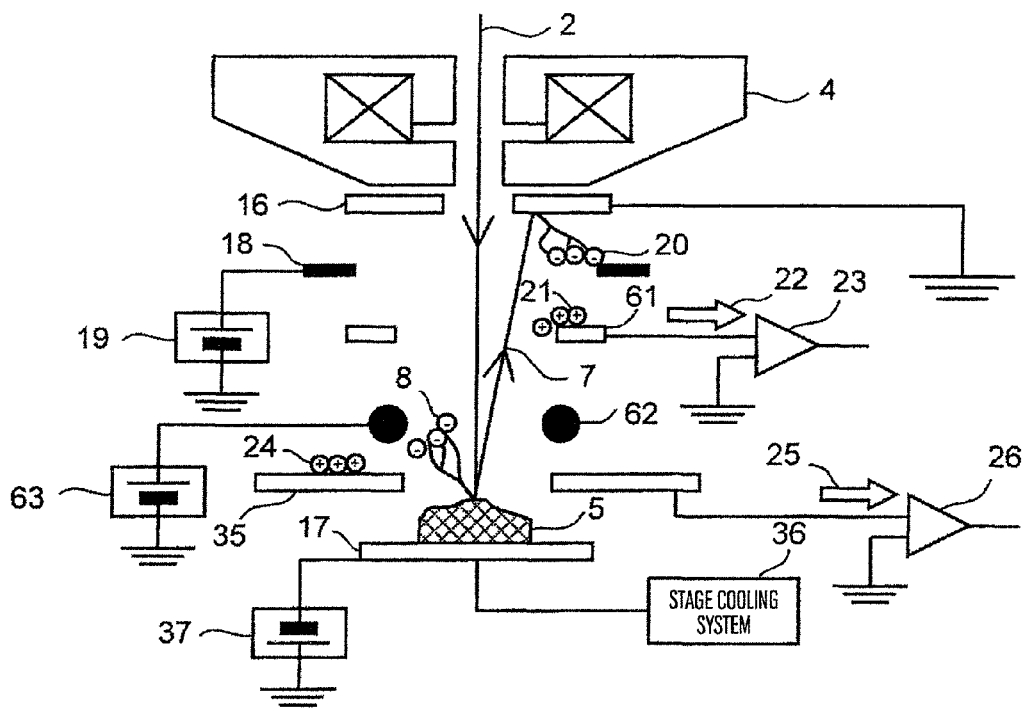
FIG. 11 is a schematic diagram illustrating still another example of construction of the optical system essential part in the second embodiment.

In another construction example shown in FIG. 11, a disk-shaped detection electrode 35 in the form of a doughnut is arranged in a gap defined by the electric field supply electrode 62 and specimen stage 17 of the FIG. 10 construction example. Positive induced current 25 originating from secondary electrons 8 are detected similarly to the examples 2 and 9. In embodiment 2, the stage cooling system 36 for cooling the specimen and specimen stage power supply 37 for accelerating secondary electrons 8 may be introduced as in the case of embodiment 1. The reflection plate 16, electric field supply electrode 18, detection electrode 61, electric field supply electrode 62 and detection electrode 35 in the present construction example may by moved upwardly or downwardly in order that the relative distance of each of these members to the specimen 5 can be conserved as the specimen stage 17 moves upward or downward.

Figure 12:
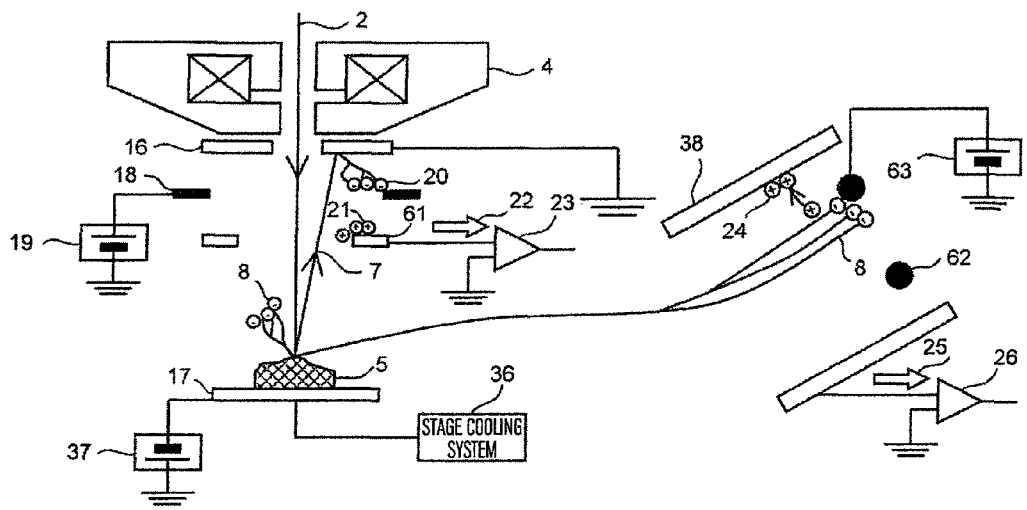
FIG. 12 is a schematic diagram illustrating still another example of construction of the optical system essential part in the second embodiment.

A modification of the FIG. 11 construction example is illustrated in FIG. 12. An apparatus of the present modification has a secondary electron detection system similar to that of the FIG. 7 construction example.

Secondary electrons 8 are gas amplified by using the electric field supply electrode. Amplified ions 24 are drifted toward a cylindrical detection electrode 38. Positive induced current 25 originating from the secondary electrons are detected with the detection electrode 38 connected with the specimen stage 17.

The analogous apparatuses of the present embodiment have been described by way of the construction examples shown in FIGS. 9 to 10 and the backscattering electron detection electrode 16 in the above-described construction examples may be divided into a plurality of segments as shown in FIG. 8.

Embodiment 3

While, in the embodiments 1 and 2, apparatuses analogous to the on-axis detection type apparatus have been explained, an embodiment in which the present invention is applied to a scanning electron microscope of off-axis detection type will now be described. The off-axis detection is a technical term in contrast to the on-axis detection and signifies a detection scheme in which in contrast to the on-axis detection for detecting backscattering electrons reflected in a direction making a relatively small azimuth angle to the optical axis of electron beam 2 (high angle backscattering electrons), backscattering electrons reflected in a direction making a large azimuth angle to the optical axis (low angle backscattering electrons) are detected off-axially by means of a detector arranged obliquely to the optical axis.

Figure 13:
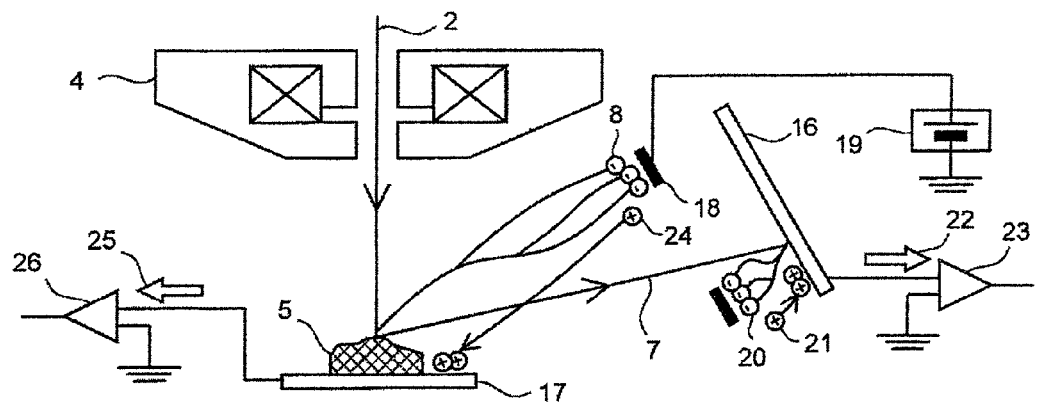
FIG. 13 is a schematic functional diagram illustrating an example of construction of an optical system essential part in a third embodiment of the invention.

Referring to FIG. 13, an example of the most basic construction for separating and detecting low vacuum secondary electrons and low vacuum backscattering electrons in the off-axis detection scheme will be described. Only an essential part for separation and detection of low vacuum secondary electrons and low vacuum backscattering electrons is illustrated in FIG. 13 and other constituent components and operations necessary for constituting and operating the scanning electron microscope are equivalent to those of the scanning electron microscope shown in FIG. 1. Accordingly, constituent components in common to FIG. 1 are not illustrated and even unless specifically noticed, this holds true for the drawings to which reference will be made hereinafter.

In the constitution example as shown in FIG. 13, a first detection electrode for detection of induced current attributable to backscattering electrons is arranged off-axially of the specimen stage 17 and a second detection electrode for detection of induced current attributable to secondary electrons is arranged on the surface of specimen stage 17. In a space defined by the second and first detection electrodes, an electric field supply electrode 18 for gas amplification is arranged and electric fields, set up by the electric field supply electrode 18 between it and each of the first and second detection electrodes, act to separate secondary electrons and backscattering electrons and drift them toward the corresponding detection electrodes. The electric field supply electrode 18 is connected with a power supply 19 for application of positive potential and the potential supplied from the power supply 19 to the electric field supply electrode 18 is controlled by the information processor 14 such that potential differences between the electric field supply electrode 18 and the individual first and second detection electrodes can be set to predetermined values. Then, the first and second detection electrodes are respectively connected with backscattering electron detection amplifier 23 and secondary electron detection amplifier 26 which are grounded. Induced current signals detected by the individual electrodes are subjected to a suitable operation process by means of the information processor 14, forming a low vacuum backscattering electron image and a low vacuum secondary electron image.

In the FIG. 13 construction example, the first detection electrode is also used as reflection plate 16 and so it has a bombardment surface on which backscattering electrons impinge. For the purpose of promoting the impingement efficiency, the reflection plate 16 is arranged at such an angle that its bombardment surface confronts the specimen stage and the center axis of the backscattering electron bombardment surface makes an acute angle to the optical axis of primary electron beam. In addition, the reflection plate 16 is arranged such that the center axis of the bombardment surface meets the optical axis of primary electron beam 2 substantially at the center of scanning of primary electron beams 2. The reflection plate 16 and electric field supply electrode 18 are shaped symmetrically to the center axis of the reflection plate.

In the FIG. 13 construction example, the reflection plate 16 and electric field supply electrode 18 may by moved upwardly or downwardly in order that the relative distance of each of these members to the specimen stage 17 can be conserved as the specimen stage 17 moves upwardly or downwardly. In this case, the up-down movement of the reflection plate 16 and electric field supply electrode 18 is executed by means of a drive unit not shown. With the specimen stage 17 fixedly stationed, both or either of the reflection plate 16 and electric field supply electrode 18 may be moved by a drive unit not shown in a direction either approaching to or departing from the specimen 5 under the condition that the center axis of reflection plate 16 meets the optical axis of primary electron beam 2 substantially at the scanning center of primary electron beam 2.

In embodiments 1 and 2, the detector is directly beneath the objective lens 4 and so, if the WD is particularly desired to be shortened (for example, WD≦5 mm), the specimen stage 17 interferes with the detector to disable the observation but with the construction in this example, the detector is arranged off-axially, making it possible to perform observation at the short WD.

Figure 14:
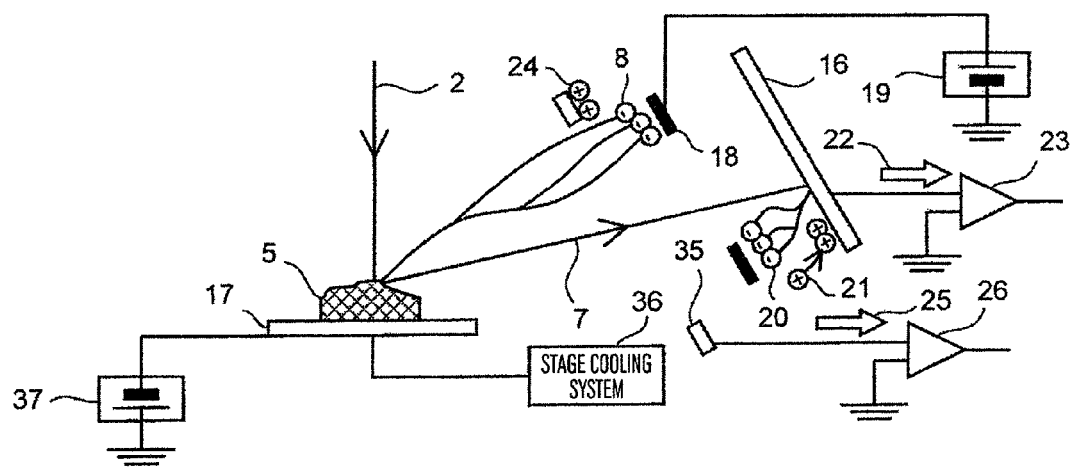
FIG. 14 is a schematic diagram illustrating another example of construction of the optical system essential part in the third embodiment.

Illustrated in FIG. 14 is another analogous construction example in the present embodiment. In the construction shown in FIG. 14, the FIG. 13 construction example is modified such that a detection electrode at ground potential is arranged in a space defined by the electric field supply electrode 18 and the specimen stage 17.

The detection electrode 35 is shaped symmetrically with the center axis of the reflection plate 16. In this example, in order to prevent the detection electrode 35 from shielding a potential gradient set up near the specimen stage 17 by means of the electric field supply electrode 18, the inner diameter of the detection electrode 35 is set to be about 3 mm to 10 mm larger than that of the electric field supply electrode 18. Secondary electrons are detected similarly to embodiment 2.

For the same reason as that for the FIG. 5 construction example, this construction example can be used in combination with the stage cooling system 36 and power supply 37 for specimen stage.

Figure 15:
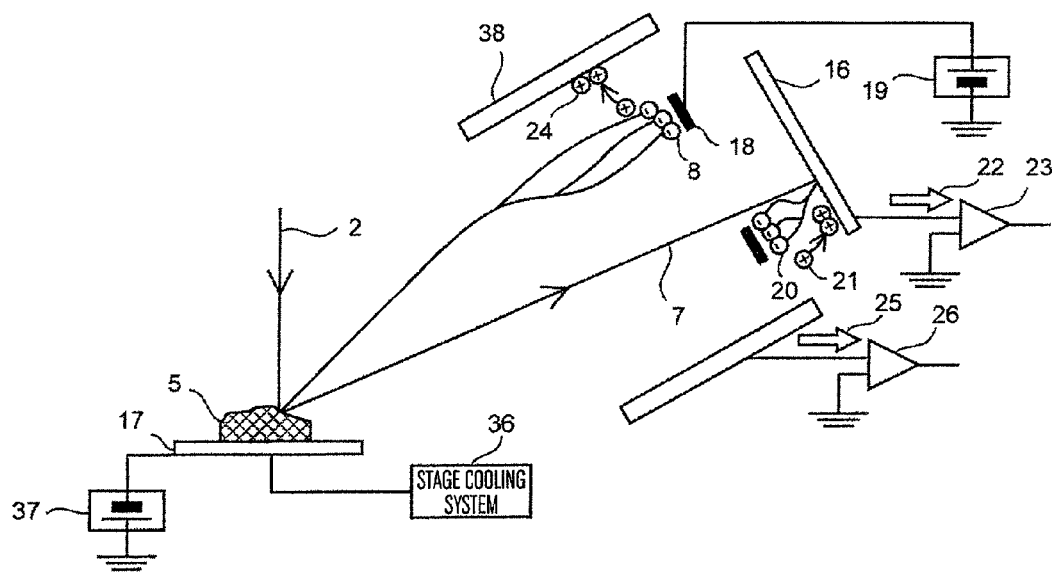
FIG. 15 is a schematic diagram illustrating still another example of construction of the optical system essential part in the third embodiment.

Illustrated in FIG. 15 is still another construction example in the present embodiment. In the construction example shown in FIG. 15, the detection electrode for secondary electron detection in the FIG. 14 construction example is shaped differently. In the case of the FIG. 15 construction example, with the aim of promoting the efficiency of detection of ions during detection of secondary electrons, a cylindrical detection electrode 38 is arranged to surround the electric field supply electrode 18. The detection electrode is at ground potential. The detection electrode 38 is disposed such that its center axis coincides with the center axis of the reflection plate 16. Generally, the inner diameter of detection electrode 38 is about 10 to 50 mmφ. Backscattering electrons 7 and secondary electrons 8 are detected similarly to the FIG. 14 construction example.

In the FIG. 15 construction example, the reflection plate 16, electric field supply electrode 18 and detection electrode 38 may be moved upwardly or downwardly in order that the relative distance of each of these members to the specimen stage 17 can be conserved as the specimen stage 17 moves upward or downward. In this case, the up-down movement of the reflection plate 16, electric field supply electrode 18 and detection electrode 38 is executed by means of a drive unit not shown. With the specimen stage 17 fixedly stationed, the reflection plate 16, electric field supply electrode 18 and detection electrode 38 may be moved by a drive unit not shown in a direction either approaching to or departing from the specimen 5 under the condition that the center axis of reflection plate 16 meets optical axis of primary electron beam 2 substantially at the scanning center of primary electron beam 2.

In all the construction examples of the present embodiment, the shape of the electric field supply electrode is not limited to the disk shape in the form of a doughnut. The gas amplification depends on the potential gradient established between the electric field supply electrode and the reflection plate, specimen stage or detection electrode at ground potential and the electric field supply electrode is so shaped as to maximize the gain of the gas amplification.

Like the FIG. 14 construction example, the FIG. 15 example can be used in combination with the stage cooling system 36 and power supply 37 for specimen stage. And besides, since the viewing angle the detection electrode 38 has for ions 24 originating from secondary electrons 8 can be large, the efficiency of capturing the ions 24 can be promoted as compared to the FIG. 14 construction example.

Figure 16:
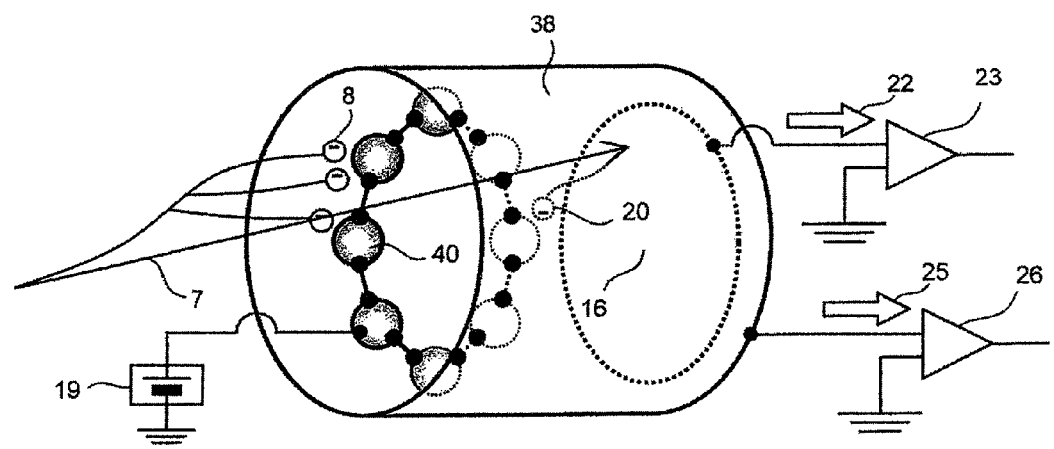
FIG. 16 is a diagram showing a modified example of an electric field supply electrode in the third embodiment.

Turning to FIG. 16, a modification of the FIG. 15 construction example will be described in which the shape of the electric field supply electrode is changed. The electric field supply electrode in the FIG. 15 construction example is constructed of the disk-shaped metal plate having an opening through which backscattering electrons pass whereas an electric field supply electrode of the present construction example is constructed of a plurality of electrodes each having a curved surface. This will be detailed hereunder. In FIG. 16, reflection plate 16 and cylindrical electrode 38 are respectively a detection electrode for induced current attributable to backscattering electrons (first detection electrode) and a detection electrode for induced current attributable to secondary electrons (second detection electrode), the first detection electrode having a bombardment surface.

A plurality of spherical electric field supply electrodes 40 are arranged in a bearing-like form internally of the cylindrical electrode 38. The individual electric field supply electrodes 40 are arranged symmetrically with respect to the center axis of cylindrical electrode 38. Preferably, each electrode is about 1 to 10 mm in size.

The plurality of electric field supply electrodes 40 are all short-circuited therethrough and a power supply 19 for application of positive potential is connected to any one of the plural electric field supply electrodes 40. Preferably, the distance between the electric field supply electrode 40 and the reflection electrode 16 or detection electrode 38 is about 1 to 10 mm.

With this construction example, thanks to the curved surface of electric field supply electrodes 40, charge prone to occur in relation to the individual detection electrodes at ground potential can be suppressed easily.

Figure 17A:
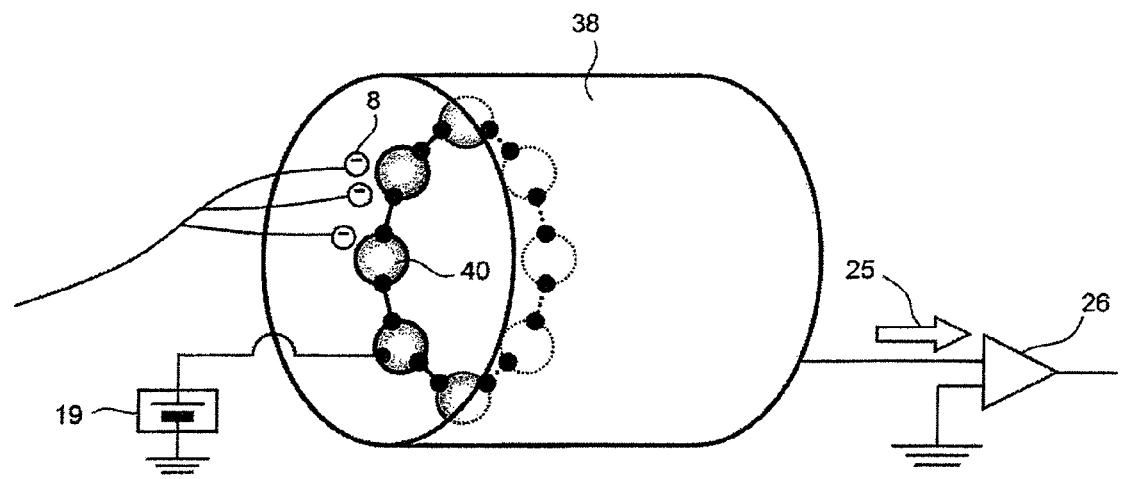
FIG. 17A is a diagram showing another modified example of the electric field supply electrode in the third embodiment.

The FIG. 16 construction example can be modified to form an apparatus removed of the reflection plate 16. This modification is illustrated in FIG. 17A. The cylindrical electrode 38 and electric field supply electrode 40 are shaped identically to the FIG. 16 construction example but the reflection plate 16 is eliminated. Backscattering electrons are detected with a detection electrode for backscattering electron detection provided independently of the cylindrical electrode. Typically, this modification is used in combination with the on-axis detection type backscattering electron detection electrode.

To add, the construction shown in FIG. 17A can be used in combination with any construction example in embodiments 1 to 3.

Figure 17B:
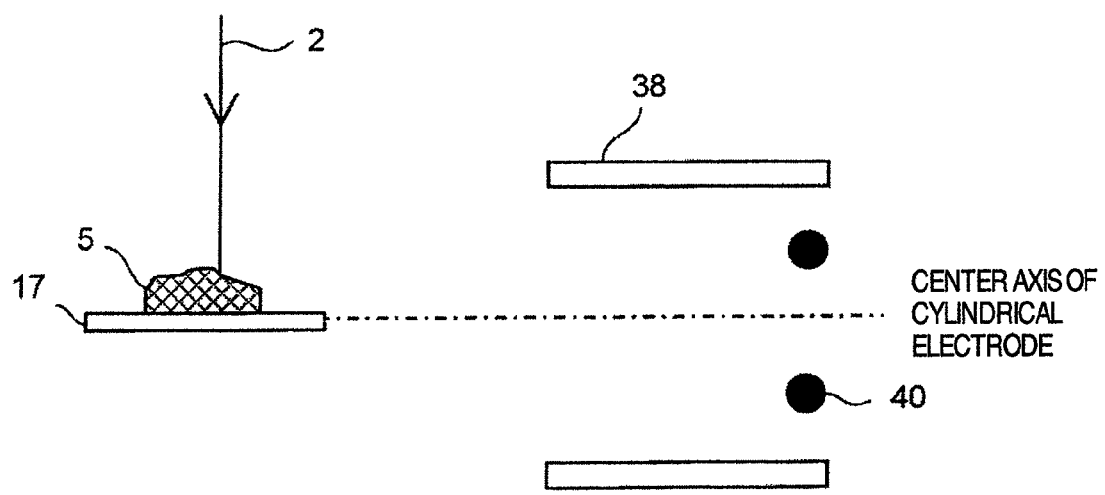
FIG. 17B is a diagram showing an example of arrangement of members in FIG. 17A modification.

The secondary electron detector in embodiments 1 and 2 does not detect only secondary electrons perfectly but detects backscattering electrons at low energy (several hundreds eV or less) as well which are attracted by an electric field formed by the electric field supply electrode before their arrival at the reflection plate. The present construction example has an advantage that the detection of backscattering electrons at low energy can be suppressed by contriving the arrangement of the secondary electron detector shown in FIG. 17A. More specifically, the cylindrical electrode 38 is so disposed that its center axis makes a right angle to the optical axis 2 of electron beam and its virtual intersections with the optical axis partly lie below the observation surface of the specimen. This state is illustrated in FIG. 17B. With this construction, no backscattering electrons excepting those at extremely low angle and low energy can reach the electric field supply electrode 40. As generally known in the art, the lower the angle, the lesser the amount of backscattering electrons given off becomes, succeeding in suppressing detection of backscattering electrons.

Embodiment 4

Figure 18:
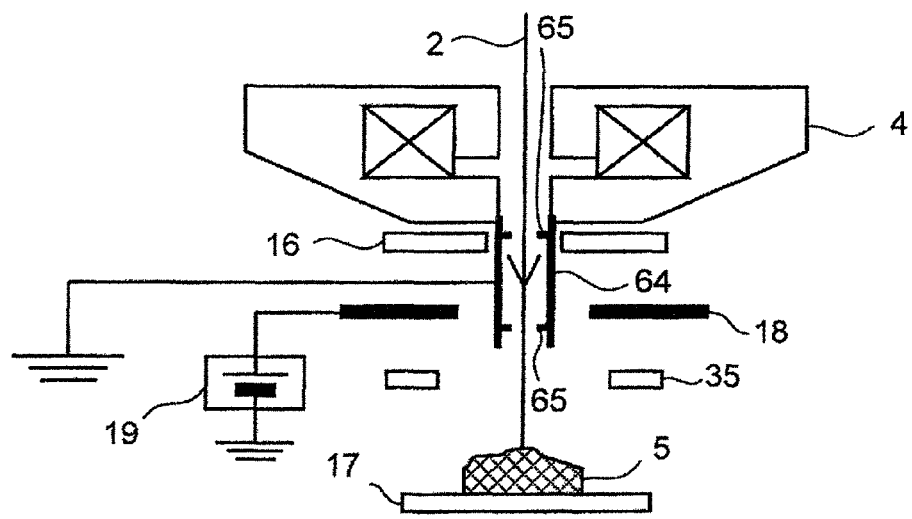
FIG. 18 is a schematic functional diagram showing an electric field shield according to a fourth embodiment of the invention.
Figure 19:
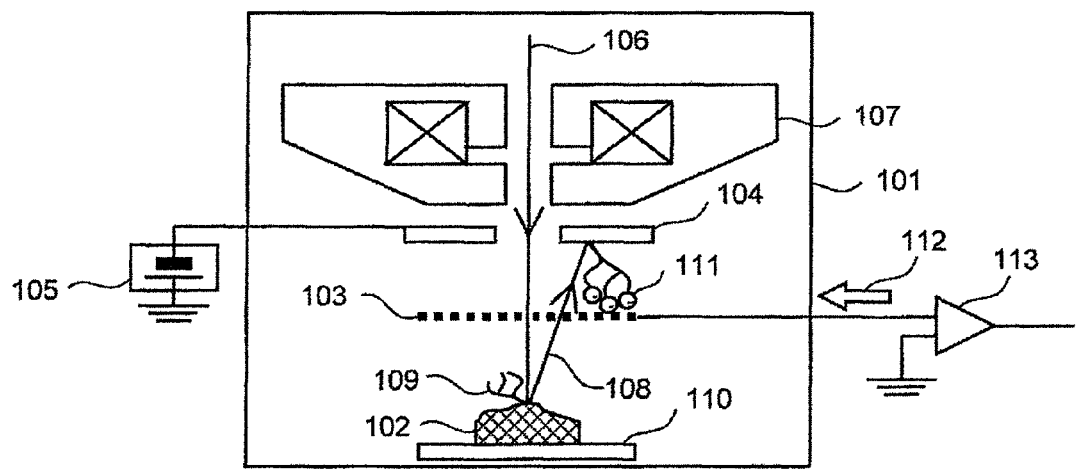
FIG. 19 is a schematic diagram showing features of JP-A-2002-516647 representing a prior art.
Figure 20:
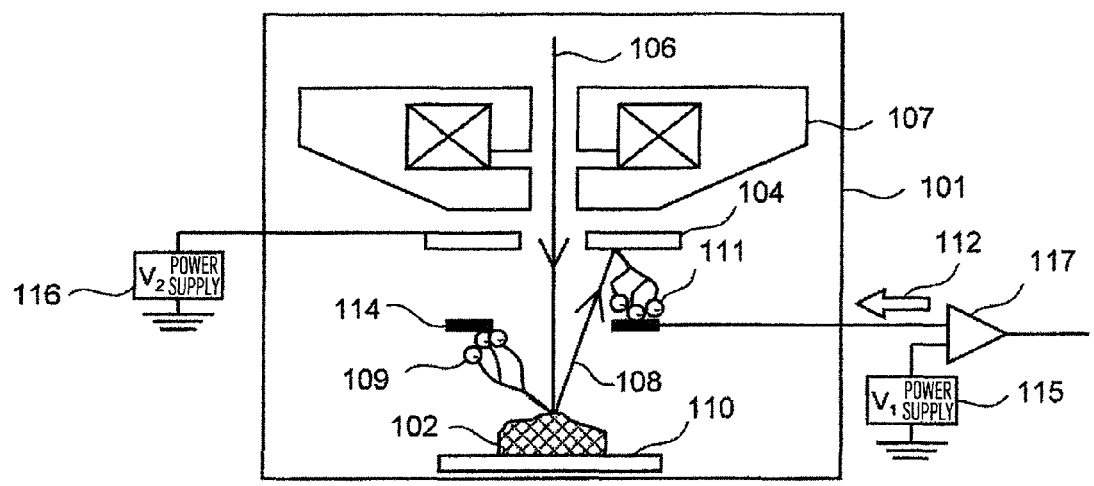
FIG. 20 is a schematic diagram showing different features of JP-A-2002-516647.

In the apparatus construction of the on-axis detection scheme, the reflection plate/first detection electrode is arranged directly beneath the electron optics column or the objective lens, so that the potential gradient set up in relation to the electric field supply electrode partly overlaps the trajectory of the primary electron beam. To eliminate this influence, an electric field shield may be disposed directly below the objective lens. In a construction example shown in FIG. 18, an electric field shield is provided for the backscattering electron bombardment surface of reflection plate 16. The electric field created by the electric field supply electrode 18 is shielded by means of the electric field shield 64 at ground potential. The electric field shield 64 may be electrically conducted to the objective lens 4. If magnetized, the electric field shield 64 affects the primary electron beam 2 and therefore it needs to be non-magnetic. To add, the electric field shield 64 may be provided with apertures 65 for differential evacuation. This permits the vacuum degree inside the electric field shield 64 to be kept higher than that inside the specimen chamber and divergence of primary electron beam 2 developing due to its scattering with gas molecules inside the electric field shield 64 can be suppressed.

The shape of detection electrode and electric field supply electrode has been described as being sorted in accordance the setting locations in connection with embodiments 1 to 4 but in the foregoing embodiments, the reflection plate may be coated or vapor-deposited with magnesium oxide, magnesium or gold at its surface on which backscattering electrons impinge. This is effective to promote the efficiency of emission of subsidiary electrons. Further, in the foregoing embodiments, a backscattering electron detector capable of directly detecting backscattering electrons, such as a semiconductor detector or micro-channel plate, can also be used as the reflection plate.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope having an electron optics column for irradiating an electron beam on a specimen, a specimen stage for holding a specimen to be observed and a specimen chamber for housing the specimen stage, whereby charged particles given off from the specimen under irradiation of the electron beam are gas-amplified through their interaction with gas molecules prevailing in the specimen chamber and amplified ions are detected as positive induced current, comprising:

a first detection electrode for detecting an induced current attributable to backscattering electrons out of charged particles given off from said specimen to be observed under irradiation of the electron beam;

a second detection electrode for detecting an induced current attributable to secondary electrons out of charged particles given off from the observed specimen under the electron beam irradiation; and means for separating ions attributable to gas amplification by the backscattering electrons and ions attributable to gas amplification by the secondary electrons and transferring them to said first and second detection electrodes, respectively, wherein:

said first detection electrode includes a bombardment surface on which the backscattering electrons impinge and said means for transferring the gas-amplified ions includes an electric field supply electrode for gas amplification, said electric field supply electrode is interposed between said specimen stage and said first detection electrode, said first detection electrode is constructed of a disk-shaped electrode, said second electrode is constructed of a cylindrical electrode arranged symmetrically with the center axis of said bombardment surface, and said electric field supply electrode is arranged internally of said cylinder.

2. A scanning electron microscope according to claim 1, wherein said first detection electrode includes a plurality of backscattering electron bombardment surfaces on which backscattering electrons having different angle components impinge, respectively.

3. A scanning electron microscope according to claim 2, wherein said first detection electrode includes a first bombardment surface on which high angle components of said backscattering electrons impinge and a second bombardment surface on which low angle components of said backscattering electrons impinge.

4. A scanning electron microscope according to claim 1 further comprising a reflection plate interposed between said first detection electrode and the bottom of said electron optics column and having a bombardment surface upon which backscattering electrons impinge, said reflection plate being grounded.

5. A scanning electron microscope according to claim 4, wherein said reflection plate is provided with an electric field shield arranged at an opening for passage of the primary electron beam, shaped symmetrically with the optical axis of the electron beam and formed of a non-magnetic material.

6. A scanning electron microscope according to claim 5, wherein said electric field shield has an aperture for differential evacuation formed internally thereof.

7. A scanning electron microscope according to claim 1, wherein said first detection electrode is arranged under the bottom of said electron optics column and includes the bombardment surface which is divided into a plurality of areas on which backscattering electrons having different azimuth angles impinge.

8. A scanning electron microscope according to claim 1, wherein said specimen stage includes said second detection electrode.

9. A scanning electron microscope according to claim 1, wherein said second detection electrode is interposed between said electric field supply electrode and said specimen stage.

10. A scanning electron microscope according to claim 1 further comprising an image processor for applying a predetermined operation to an induced current signal detected from said first or second detection electrode to provide a single synthesis image which in turn is outputted.

11. A scanning electron microscope according to claim 1, wherein the electric field supply electrode applied with positive potential.

12. A scanning electron microscope according to claim 1, wherein the specimen stage is provided with the second detection electrode.

13. A scanning electron microscope according to claim 1, wherein the second detection electrode is interposed between the electric field supply electrode and specimen stage.

14. A scanning electron microscope having an electron optics column for irradiating an electron beam on a specimen, a specimen stage for holding a specimen to be observed and a specimen chamber for housing the specimen stage, whereby charged particles given off from the specimen under irradiation of the electron beam are gas-amplified through their interaction with gas molecules prevailing in the specimen chamber and amplified ions are detected as positive induced current, comprising:

a first detection electrode for detecting an induced current attributable to backscattering electrons out of charged particles given off from said specimen to be observed under irradiation of the electron beam;

a second detection electrode for detecting an induced current attributable to secondary electrons out of charged particles given off from said observed specimen under the electron beam irradiation; and means for separating ions attributable to gas amplification by the backscattering electrons and ions attributable to gas amplification by the secondary electrons and transferring them to said first and second detection electrodes, respectively, wherein:

said means for transferring the gas-amplified ions includes an electric field supply electrode for gas amplification interposed between said specimen stage and said first detection electrode, said first detection electrode is arranged at a position constantly distant from the optical axis of the illuminating electron beam in a space defined by the bottom of said electron optics column and said specimen stage, having its bombardment surface confronting said specimen stage, said first detection electrode is constructed of a disk-shaped electrode, said second electrode is constructed of a cylindrical electrode arranged symmetrically with the center axis of said bombardment surface, and said electric field supply electrode is arranged internally of said cylinder.

15. A scanning electron microscope according to claim 14, wherein said electric field supply electrode is constructed of a plurality of semispherical electrodes provided internally of said cylindrical electrode.

* * * * *